US011211128B1

(12) United States Patent
Sheperek et al.

(10) Patent No.: US 11,211,128 B1
(45) Date of Patent: Dec. 28, 2021

(54) PERFORMING THRESHOLD VOLTAGE OFFSET BIN SELECTION BY PACKAGE FOR MEMORY DEVICES

(71) Applicant: Micron Technology, Inc., Boise, ID (US)

(72) Inventors: Michael Sheperek, Longmont, CO (US); Kishore Kumar Muchherla, Fremont, CA (US); Mustafa N. Kaynak, San Diego, CA (US); Vamsi Pavan Rayaprolu, San Jose, CA (US); Bruce A. Liikanen, Berthoud, CO (US); Larry J. Koudele, Erie, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/061,713

(22) Filed: Oct. 2, 2020

(51) Int. Cl.
| | |
|---|---|
| *G11C 16/20* | (2006.01) |
| *G11C 16/26* | (2006.01) |
| *G11C 16/32* | (2006.01) |
| *G11C 16/34* | (2006.01) |
| *G11C 16/30* | (2006.01) |

(52) U.S. Cl.
CPC .............. *G11C 16/20* (2013.01); *G11C 16/26* (2013.01); *G11C 16/30* (2013.01); *G11C 16/32* (2013.01); *G11C 16/3404* (2013.01); *G11C 2207/2254* (2013.01)

(58) Field of Classification Search
CPC .......... G11C 8/12; G11C 16/20; G11C 16/26; G11C 16/30; G11C 16/32; G11C 16/3404
See application file for complete search history.

(56) References Cited

U.S. PATENT DOCUMENTS

| | | | |
|---|---|---|---|
| 2017/0017588 A1* | 1/2017 | Frid | G06F 3/0658 |
| 2019/0066802 A1* | 2/2019 | Malshe | G11C 16/349 |

* cited by examiner

*Primary Examiner* — Han Yang
(74) *Attorney, Agent, or Firm* — Lowenstein Sandler LLP

(57) ABSTRACT

An example memory sub-system includes a memory device and a processing device, operatively coupled to the memory device. The processing device is configured to initialize a block family associated with the memory device; program a first block in a first die of the memory device and a second block in a second die of the memory device, wherein the first die and the second die are assigned to a die group; associate the first block and the second block with the block family; and associate the die group with a first threshold voltage offset bin.

20 Claims, 10 Drawing Sheets

Voltage Boundary Table 310

| Bin | Boundary |
|---|---|
| 0 | < V1 |
| 1 | < V2 |
| 2 | < V3 |
| 3 | < V4 |
| 4 | < V5 |
| 5 | < V6 |
| 6 | < V7 |
| 7 | >= V7 |

Voltage Offset Table 320

Voltage Offsets

| Level\Bin | Bin 0 | Bin 1 | Bin 2 | Bin 3 | Bin 4 | Bin 5 | Bin 6 | Bin 7 |
|---|---|---|---|---|---|---|---|---|
| L1 | V10 | V11 | V12 | V13 | V14 | V15 | V16 | V17 |
| L2 | V20 | V21 | V22 | V23 | V24 | V25 | V26 | V27 |
| L3 | V30 | V31 | V32 | V33 | V34 | V35 | V36 | V37 |
| L4 | V40 | V41 | V42 | V43 | V44 | V45 | V46 | V47 |
| L5 | V50 | V51 | V52 | V53 | V54 | V55 | V56 | V57 |
| L6 | V60 | V61 | V62 | V63 | V64 | V65 | V66 | V67 |
| L7 | V60 | V61 | V62 | V63 | V64 | V65 | V66 | V67 |

Voltage Bin for TAP=0 hours 322

Voltage Bin for TAP=T hours 324

PERFORMING THRESHOLD VOLTAGE OFFSET BIN SELECTION BY PACKAGE FOR MEMORY DEVICES

TECHNICAL FIELD

Embodiments of the disclosure are generally related to memory sub-systems, and more specifically, are related to performing threshold voltage offset bin selection by package for memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 3 depicts an example voltage boundary table and an example voltage offset table.

FIG. 7 schematically illustrates example metadata maintained by the memory sub-system controller for associating blocks and/or partitions with block families, in accordance with embodiments of the present disclosure.

DETAILED DESCRIPTION

Figure 1:
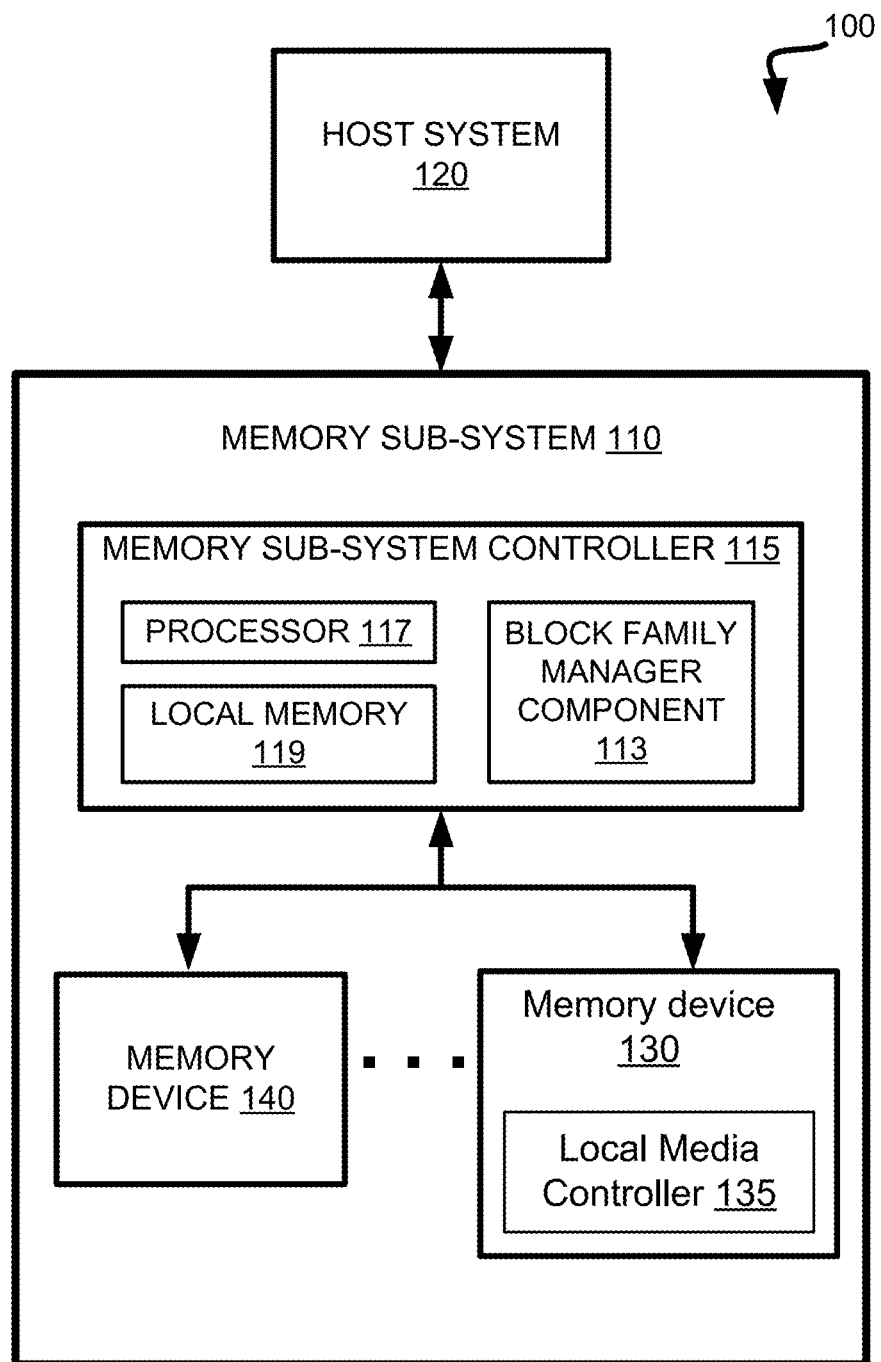
FIG. 1 illustrates an example computing system that includes a memory sub-system in accordance with some embodiments of the present disclosure.

Embodiments of the present disclosure are directed to performing threshold voltage offset bin selection by package for memory devices. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is one or more packages of one or more dice. Each die can consist of one or more planes. Planes can be groups into logic units (LUN). For some types of non-volatile memory devices (e.g., NAND devices), each plane consists of a set of physical blocks. Each block consists of a set of pages. "Block" herein shall refer to a set of contiguous or non-contiguous memory pages. An example of "block" is "erasable block," which is the minimal erasable unit of memory, while "page" is a minimal writable unit of memory. Each page includes of a set of memory cells. A memory cell is an electronic circuit that stores information.

A package can include a substrate having one or more dice. For example, a memory device can include a single die per package, two dice per package, four dice per package, etc. Each memory device can have one or more packages of dice (e.g., four packages consisting of one die each, two packages consisting of four dice each, two packages consisting of two dice and four dice, respectively, etc.). Dice in a memory device can further be grouped into sub-packages. The grouping can be based on dice experiencing similar temperature changes during a read operation or a write operation. In an illustrative example, a memory device can have two packages of four dice each. The dice in each package can be stacked on top of each other, causing the two inner dice to run hotter than the two outer die. Accordingly, the four inner dice of both packages can be grouped into a first sub-package, and the four outer dice of both packages can be grouped into a second sub-package. A firmware data structure of the memory sub-system can indicate which dice are associated with which package and/or sub-package in a data structure.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss, the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

However, various common implementations either fail to adequately address the temporal voltage shift or employ inefficient strategies resulting in high bit error rates and/or exhibiting other shortcomings. Embodiments of the present disclosure address the above-noted and other deficiencies by implementing a memory sub-system that employs block family based error avoidance strategies, thus significantly improving the bit error rate exhibited by the memory sub-system.

In accordance with embodiments of the present disclosure, the temporal voltage shift is selectively tracked for programmed blocks grouped by block families, and appropriate voltage offsets, which are based on block affiliation with a certain block family, are applied to the base read levels in order to perform read operations. "Block family" herein shall refer to a possibly noncontiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics. A block family may be made with any granularity, containing only whole codewords, whole pages, whole super pages, or whole superblocks, or any combination of these. Since the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations. "Base read level" herein shall refer to the initial threshold voltage level exhibited by the memory cell immediately after programming. In some implementations, base read levels can be stored in the metadata of the memory device.

Block families can be created asynchronously with respect to block programming events. In an illustrative example, a new block family can be created whenever a specified period of time (e.g., a predetermined number of minutes) has elapsed since creation of the last block family or the reference temperature of memory cells has changed by more than a specified threshold value. The memory sub-system controller can maintain an identifier of the active block family, which is associated with one or more blocks as they are being programmed.

The memory sub-system controller can periodically perform a calibration process in order to associate each die group (e.g., package) of every block family with a predefined threshold voltage offset bin, which is in turn associated with the voltage offset to be applied for read operations. The associations of blocks with block families and block families and packages with threshold voltage offset bins can be stored in respective metadata tables maintained by the memory sub-system controller.

Upon receiving a read command, the memory sub-system controller can identify the block family associated with the block identified by the logical block address (LBA) specified by the read command, identify the threshold voltage offset bin associated with the block family and package on which the block resides, compute the new threshold voltage by additively applying the threshold voltage offset associated with the threshold voltage offset bin to the base read level, and perform the read operation using the new threshold voltage, as described in more detail herein below.

Therefore, advantages of the systems and methods implemented in accordance with some embodiments of the present disclosure include, but are not limited to, improving the bit error rate in read operations by maintaining metadata tracking groups of blocks (block families) that are presumed to exhibit similar voltage distributions and selectively performing calibration operations for limited subsets of blocks based on their block family association, as described in more detail herein below.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "superblock."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a block family manager component 113 that can be used to implement the block family-based error avoidance strategies in accordance with embodiments of the present disclosure. In some embodiments, the controller 115 includes at least a portion of the block family manager component 113. For example, the controller 115 can include a processor 117 (processing device) configured to execute instructions stored in local memory 119 for performing the operations described herein. In some embodiments, the block family manager component 113 is part of the host system 120, an application, or an operating system. The block family manager component 113 can manage block families associated with the memory devices 130, as described in more detail herein below.

Figure 2:
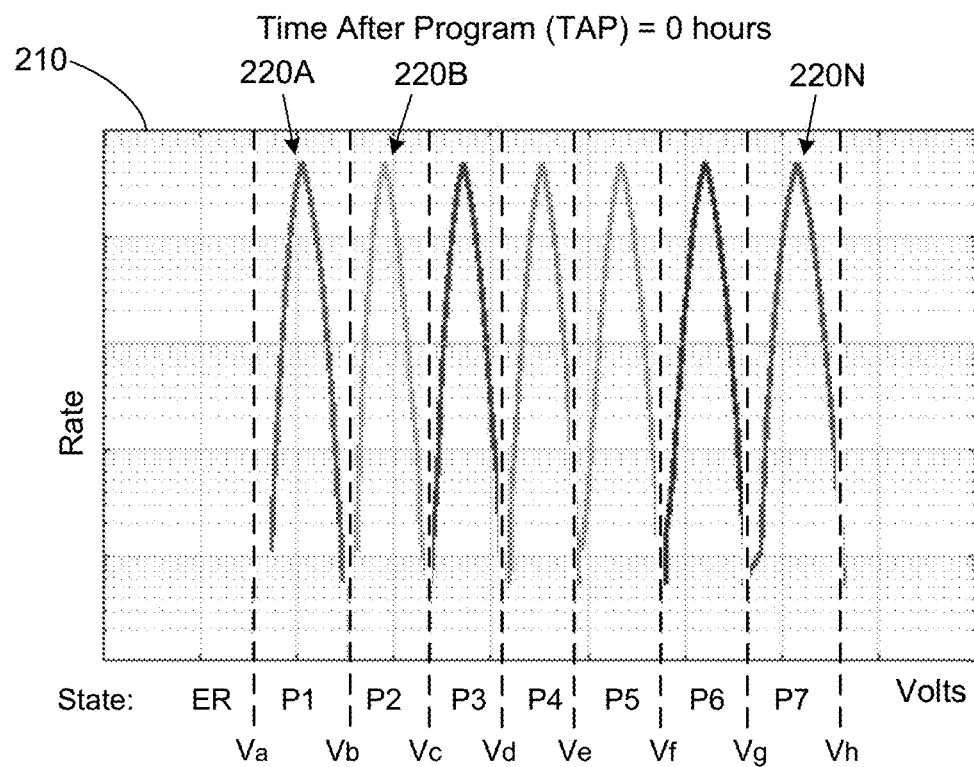
FIG. 2 schematically illustrates the temporal voltage shift caused by the slow charge loss exhibited by triple-level memory cells, in accordance with some embodiments of the present disclosure.
Figure 2:
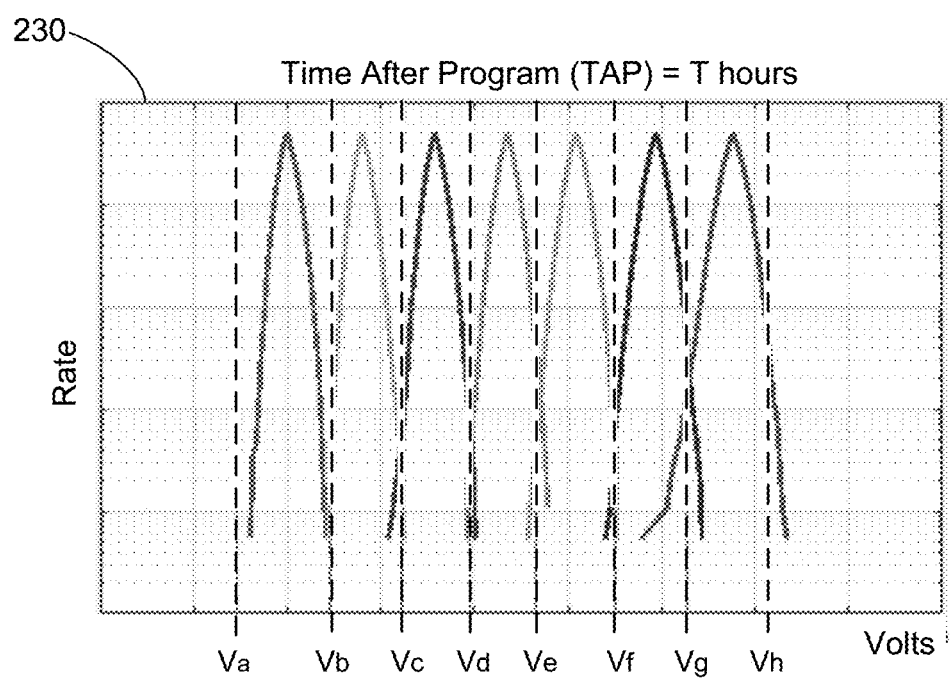

FIG. 2 illustrates the temporal voltage shift caused at least in part by the slow charge loss exhibited by triple-level memory cells, in accordance with embodiments of the disclosure. While the illustrative example of FIG. 2 utilizes triple-level cells, the same observations can be made and, accordingly, the same remedial measures are applicable to single level cells and any memory cells having multiple levels.

A memory cell can be programmed (written to) by applying a certain voltage (e.g. program voltage) to the memory cell, which results in an electric charge stored by the memory cell. Precisely controlling the amount of the electric charge stored by the memory cell allows a memory cell to have multiple threshold voltage levels that correspond to different logical levels, thus effectively allowing a single memory cell to store multiple bits of information. A memory cell operated with $2^n$ different threshold voltage levels is capable of storing n bits of information.

Each of chart 210 and 230 illustrate program voltage distributions 220A-420N (also referred to as "program distributions" or "voltage distributions" or "distributions" herein) of memory cells programmed by a respective write level (which can be assumed to be at the midpoint of the program distribution) to encode a corresponding logical level. The program distributions 220A through 220N can illustrate the range of threshold voltages (e.g., normal distribution of threshold voltages) for memory cells programmed at respective write levels (e.g., program voltages). In order to distinguish between adjacent program distributions (corresponding to two different logical levels), the read threshold voltage levels (shown by dashed vertical lines) are defined, such that any measured voltage that falls below a read threshold level is associated with one program distribution of the pair of adjacent program distributions, while any measured voltage that is greater than or equal to the read threshold level is associated with another program distribution of the pair of neighboring distributions.

In chart 210, eight states of the memory cell are shown below corresponding program distributions (except for the state labeled ER, which is an erased state, for which a distribution is not shown). Each state corresponds to a logical level. The threshold voltage levels are labeled Va-Vh. As shown, any measured voltage below Va is associated with the ER state. The states labeled P1, P2, P3, P4, P5, P6, and P7 correspond to distributions 22A-220N, respectively.

Time After Program (TAP) herein shall refer to the time since a cell has been written and is the primary driver of TVS (temporal voltage shift). TAP can be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement can be made (e.g., perform reference calibration from 8 to 12 minutes after program). A time slice can be referenced by its center point (e.g., 10 minutes).

As seen from comparing example charts 210 and 230, which reflect the time after programming (TAP) of 0 (immediately after programming) and the TAP of T hours (where T is a number of hours), respectively, the program distributions change over time due primarily to slow charge loss. In order to reduce the read bit error rate, the corresponding read threshold voltages are adjusted to compensate for the shift in program distributions, which are shown by dashed vertical lines. In various embodiments of the disclosure, the temporal voltage shift is selectively tracked for die groups based on measurements performed at one or more representative dice of the die group. Based on the measurements made on representative dice of a die group that characterize the temporal voltage shift and operational temperature of the dice of the die group, the read threshold voltage offsets used to read the memory cells for the dice of the die group are updated and are applied to the base read threshold levels to perform read operations.

FIG. 3 depicts an example voltage boundary table and an example voltage offset table. The voltage boundary table 310 and the voltage offset table 320 can be used to determine read level offsets, which are added to a base read level voltage to read data from memory cells. As the time after program increases, the threshold voltages for the distribution of the memory cell can change as a result of storage charge loss, as illustrated in the example of FIG. 2. To determine the appropriate read level offset for reading a cell, a measurement of the cell can be performed to estimate the time after program of the cell based on data state metrics such as voltages. For example, the level 7 distribution of the cell can be measured, and the difference between the measured read level (e.g., 100 millivolts) and a reference read level (e.g., 0 volts) can be determined. The difference corresponds to the time after program of the memory cell, and can be used to identify a read level offset to add to the base read threshold level to perform read operations.

The voltage boundary table 310 can be used to identify a bin that contains read offsets for use in reading data from the memory cell. The bin to be used is the value of the Bin column for which the voltage difference (between the measured read level and the reference read level) corresponds to a voltage range shown in the Boundaries column. For example, if the difference is less than V1, then bin 0 is to be used. If the difference is between V1 and V2, then bin 1 is to be used, and so on. The voltage offsets table can be used to identify the read level offsets to be used for the identified bin. For example, if the bin to be used is bin 0, then the corresponding one of the offsets shown in the column labeled "Bin 0" 322 (e.g., V10, V20, ... V60) is to be added to the base read offset level (and any other offsets) for each of levels 1-7 when reading the memory cell. "Bin 0" 322 corresponds to the time after program of 0 hours shown in FIG. 2. A column "Bin 5" 324 corresponds to the time after program of T hours shown in FIG. 2, and has offsets of greater magnitude. Bin numbers less than a threshold age value can be referred to as "younger bins" and bin numbers greater than or equal to the threshold age value can be referred to as "older bins." For example, if the threshold age value is the bin number 5, then bins 0-4 can be referred to as younger bins, and bins 5-7 can be referred to as older bins. As another example, if the threshold age value is the bin number 4, then bins 0-3 can be referred to as younger bins, and bins 4-7 can be referred to as older bins.

As described above, "read level" herein shall refer to a voltage position. Read levels are numbered in increasing voltage from L1 through 2^(number of bits). As an example, for TLC, the read levels would be L1, L2, ..., L7. "Read level value" herein shall refer to a voltage or DAC value representing a voltage that that is applied to the read element (often, the control gate for a NAND cell) for purposes of reading that cell. "Read level offset" herein shall refer to a component of the equation that determines the read level value. Offsets can be summed (i.e., read level value=offset_a+offset_b+ ... ). By convention, one of the read level offsets can be called the read level base. "Calibration" herein shall refer to altering a read level value (possibly by adjusting a read level offset or read level base) to better match the ideal read levels for a read or set of reads.

As described above, "bin" (or "voltage bin" or "voltage offset bin") herein shall refer to a set of read level offsets that are applied to a set of data. The bin offsets are read level offsets that affect the read level for block families within the bin. In this context, a bin is usually primarily directed at addressing TVS, but can also be directed at other mechanisms (e.g., temperature coefficient (tempco) miscalibration). An old or older bin is one where the read level offsets are directed at data that was written at a relatively early time. A young or younger bin is one where the read level offsets are directed at data written relatively recently. The read level adjustments can be implemented through either offsets or read retries, or even as an adjustment to the base. Bin selection herein shall refer to the process by which the memory device selects which bin to use for a given read.

Figure 4A:
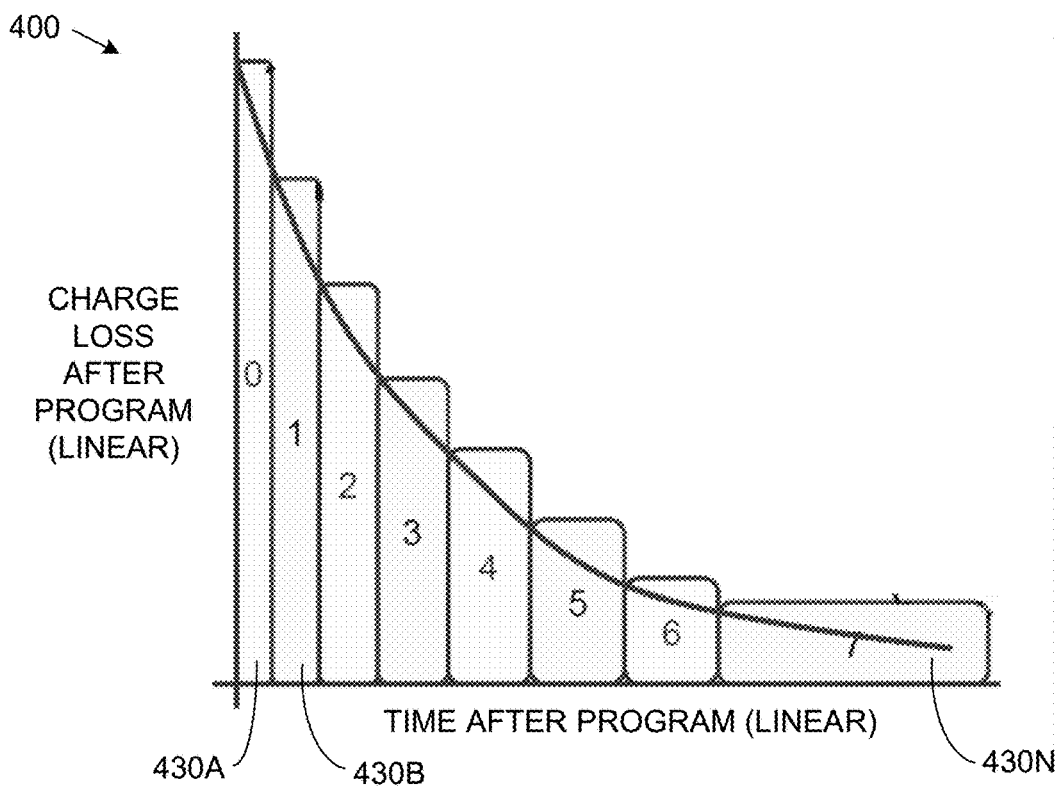
FIG. 4A depicts an example graph illustrating the dependency of the threshold voltage offset on the time after program (i.e., the period of time elapsed since the block has been programmed, in accordance with some embodiments of the present disclosure.

FIG. 4A depicts an example graph 400 illustrating the dependency of the threshold voltage offset on the time after program (i.e., the period of time elapsed since the block has been programmed, in accordance with some embodiments of the present disclosure. As schematically illustrated by FIG. 4A, blocks families of the memory device are grouped into bins 430A-430N, such that each block family includes one or more blocks that have been programmed within a specified time window and a specified temperature window. As noted herein above, since the time elapsed after programming and temperature are the main factors affecting the temporal voltage shift, all blocks and/or partitions within a single block family—are presumed to exhibit similar distributions of threshold voltages in memory cells, and thus would require the same voltage offsets for read operations.

Block families can be created asynchronously with respect to block programming events. In an illustrative example, the memory sub-system controller 115 of FIG. 1 can create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family. The memory sub-system controller can maintain an identifier of the active block family, which is associated with one or more blocks as they are being programmed.

A newly created block family can be associated with bin 0. Then, the memory sub-system controller can periodically perform a calibration process in order to associate each die of every block family with one of the predefined voltage bins (bins 0-7 in the illustrative example of FIG. 4A), which is in turn associated with the voltage offset to be applied for read operations. The associations of blocks with block families and block families and dice with voltage bins can be stored in respective metadata tables maintained by the memory sub-system controller, such as metadata tables described with respect to FIG. 7 below.

In some embodiments, the memory sub-system controller 115 can periodically perform a calibration process in order to associate one or more packages or one or more sub-packages of every block family with one of the predefined threshold voltage offset bins (bins 0-7 in the illustrative example of FIG. 4A). The associations of blocks with block families and block families and packages and/or sub-packages with threshold voltage offset bins can also be stored in respective metadata tables maintained by the memory sub-system controller.

A package can include of one or more dice, and the memory sub-system 110 can include one or more packages. Packages can be determined during manufacturing of the memory sub-system 110, and can be determined by an amount of die on a substrate. For example, the memory sub-system can include two substrates each including four die (two packages), one substrate including two die (one package), four substrates each including one die (four packages), etc. A sub-package can relate to a grouping of multiple dice from one or more packages of the memory sub-system 110. Each sub-package can be set during manufacturing of the memory sub-system 110 or programmed post manufacturing. A firmware data structure maintained by the memory sub-system controller 115 can indicate which dice are associated with each package and/or sub-package.

In various examples, the memory sub-system 110 can include a single die per package, two dice per package, four dice per package, etc. Each memory sub-system 110 can have one or more packages of one or more die (e.g., four packages consisting of one die each, two packages consisting of four dice each, two packages consisting of two dice and four dice, respectively, etc.). In an illustrative example, a package can include two or more die stacked (one on top of the other) on a substrate, side-by-side combinations of one or more die stacks and/or one or more unstacked die(s) on a substrate, multiple rows of dice on a substrate, a single die on a substrate, etc.

In some exemplary embodiments where dice in a package experience low temperature variance in relation to each other (e.g., a row of unstacked dies), the memory sub-system controller 115 can be programmed to periodically perform the calibration process to associate one or more packages of every block family with one of the predefined threshold voltage offset bins. Each of one or more packages of every block family can be independently associated with a bin.

In some exemplary embodiments, the memory sub-system controller 115 can be programmed to periodically perform the calibration process to associate one or more sub-packages of every block family with one of the predefined threshold voltage offset bins. Each of the one or more sub-packages of every block family can be independently associated with a bin.

A sub-package can include multiple dice grouped from one or more packages. Each sub-package can be set during manufacturing of the memory sub-system 110 or programmed a user post manufacturing, and indicated in a firmware data structure of the memory sub-system controller 115. The dice in a sub-package can be grouped based on their temperature properties.

The temperature properties can relate to changes in temperature of each die in the memory device based on the configuration of the dies (e.g., stacked, unstacked, rows, etc.). For example, a side-by-side row of unstacked die can experience similar temperature changes during a read operation or a write operation, while the temperature of each die in a stack can vary significantly during a read operation or a write operation. This can be because the inner dice are heated by the outer dice and the outer dice dispel heat faster than the inner dice. The variance in temperature of the dice can cause each die to experience different temporal voltage shifts. In an illustrative example where two packages include four stacked dice each, the inner dice of the stacks can run hotter than the outer dice, resulting in the inner dice experiencing a faster temporal voltage shift than the outer dice.

Accordingly, dice that experience low temperature variance in relation to each other can be grouped in the same sub-package because their temporal voltage shifts will be similar and they can be placed in the same bin during the calibration process. In an illustrative example where two packages include four stacked dice each, the inner dice of the stacks of both packages (which can run hotter than the outer dice) can be grouped in a first sub-package, and the outer dice of both packages can be grouped in a second sub-package, assuming that the dice within each of the sub-packages would experience similar temporal voltage shifts.

Therefore, the memory sub-system controller 115 can select a single die from each package or sub-package when performing the calibration process. Accordingly, the memory sub-system controller 115 can select a voltage offset bin for all dice in the package or sub-package based on the temporal voltage shift of the selected die. The die can be selected randomly, or based on a predetermined dice in the package or sub-package. In some embodiments, the memory sub-system controller 115 can select multiple dice from each package or sub-package when performing the calibration process. Alternatively, the calibration process can be performed based on multiple dice from each sub-package. The memory sub-system controller 115 can use different methods for bin selection, such as, for example, determining an average temporal voltage shift of the multiple dice, using the higher temporal voltage shift for bin selection (e.g., if a die's temporal voltage shift would associate the die with bin 2, and another die's temporal voltage shift would associate the die with bin 3, associating the package or sub-package with bin 3), using the lower temporal voltage shift for bin selection (e.g., if a die's temporal voltage shift would associate the die with bin 2, and another die's temporal voltage shift would associate the die with bin 3, associating the package or sub-package with bin 2), etc. In another example, each die within a package and/or sub-package can be associated with one or more pre-characterized threshold voltage offsets in relation to each other die associated with the package and/or sub-package. Accordingly, a calibration process can be performed on a single die in a package and/or sub-packages, associated with a bin based on the calibration process, and each other die in the package and/or sub-package can be assigned to a bin based on the calibration process of the single die and the pre-characterized threshold voltage offsets for each other die associated with the package and/or sub-package.

Figure 4B:
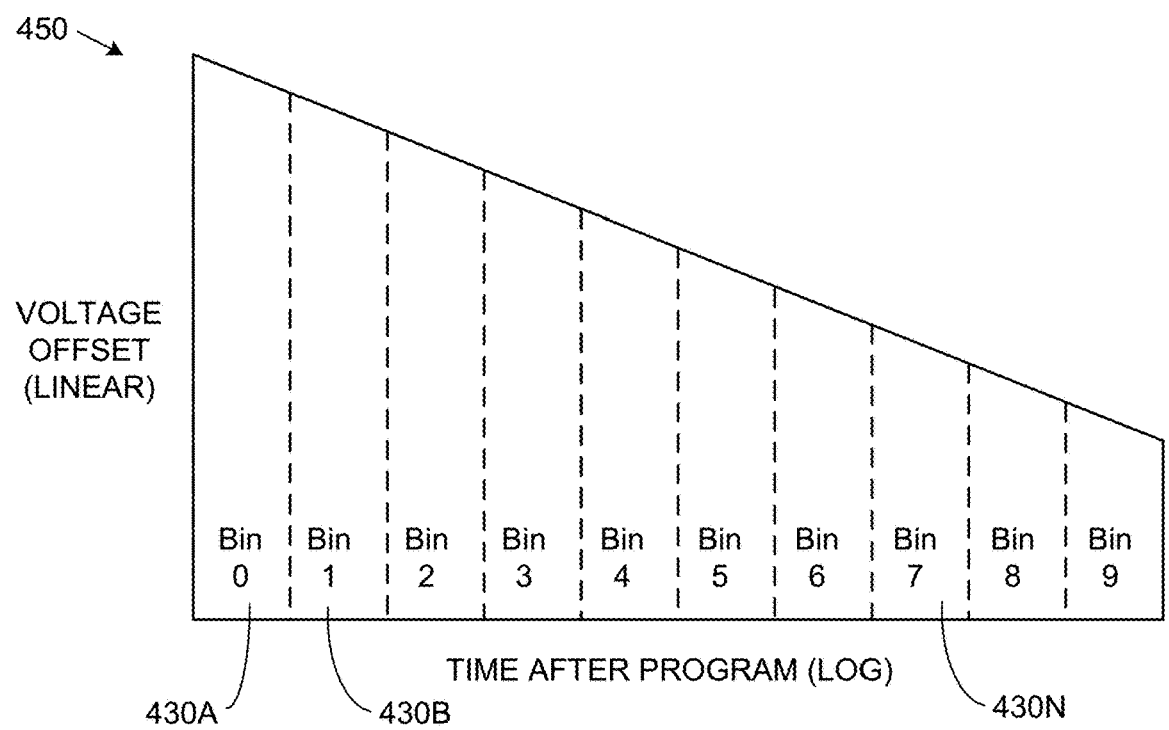
FIG. 4B schematically illustrates a set of predefined voltage bins, in accordance with embodiments of the present disclosure.

FIG. 4B schematically illustrates a set of predefined threshold voltage bins, in accordance with embodiments of the present disclosure. As schematically illustrated by FIG. 4B, the threshold voltage offset graph 450 can be subdivided into multiple voltage bins, such that each voltage bin corresponds to a predetermined range of threshold voltage offsets. While the illustrative example of FIG. 4B defines ten voltage bins, in other implementations, various other numbers of voltage bins can be employed (e.g., 64 bins). The memory sub-system controller can associate each die of every block family with a voltage bin, based on a periodically performed calibration process, described in further detail below.

Figure 5:
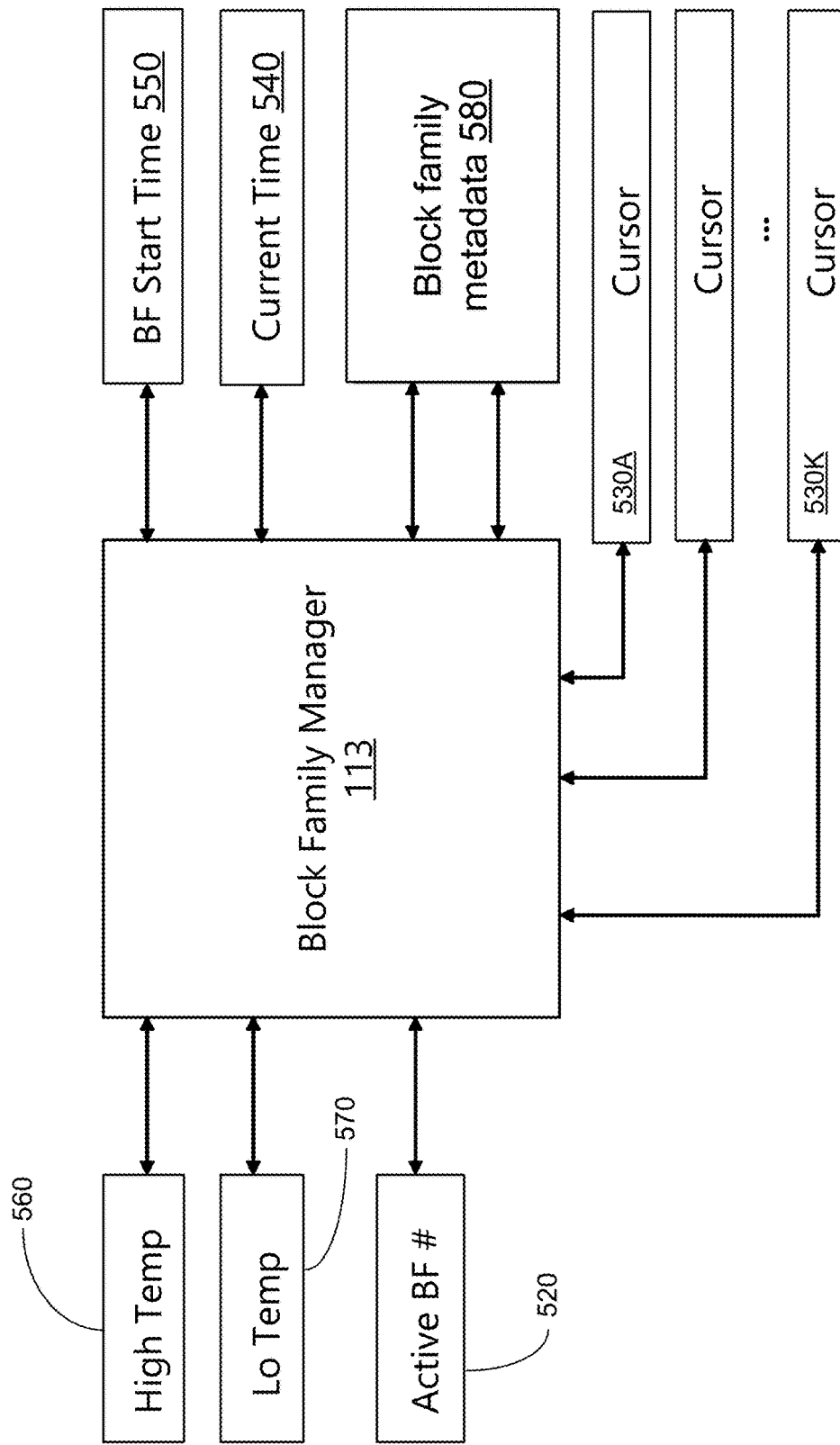
FIG. 5 schematically illustrates block family management operations implemented by the block family manager component of the memory-sub-system controller operating in accordance with embodiments of the present disclosure.

FIG. 5 schematically illustrates block family management operations implemented by the block family manager component of the memory-sub-system controller operating in accordance with embodiments of the present disclosure. As schematically illustrated by FIG. 5, the block family manager 510 can maintain, in a memory variable, an identifier 520 of the active block family, which is associated with one or more blocks of cursors 530A-530K as they are being programmed. "Cursor" herein shall broadly refer to a location on the memory device to which the data is being written.

The memory sub-system controller can utilize a power on minutes (POM) clock for tracking the creation times of block families. In some implementations, a less accurate clock, which continues running when the controller is in various low-power states, can be utilized in addition to the POM clock, such that the POM clock is updated based on the less accurate clock upon the controller wake-up from the low-power state.

Thus, upon initialization of each block family, the current time 540 is stored in a memory variable as the block family start time 550. As the blocks are programmed, the current time 540 is compared to the block family start time 550. Responsive to detecting that the difference of the current time 540 and the block family start time 550 is greater than or equal to the specified time period (e.g., a predetermined number of minutes), the memory variable storing the active block family identifier 520 is updated to store the next block family number (e.g., the next sequential integer number), and the memory variable storing the block family start time 550 is updated to store the current time 540.

The block family manager 510 can also maintain two memory variables for storing the high and low reference temperatures of a selected die of each memory device. Upon initialization of each block family, the high temperature 560 and the low temperature 570 variable store the value of the current temperature of the selected die of the memory device. In operation, while the active block family identifier 520 remains the same, temperature measurements are periodically obtained and compared with the stored high temperature 560 and the low temperature 570 values, which are updated accordingly: should the temperature measurement be found to be greater than or equal to the value stored by the high temperature variable 560, the latter is updated to store that temperature measurement; conversely, should the temperature measurement be found to fall below the value stored by the low temperature variable 570, the latter is updated to store that temperature measurement.

The block family manager 510 can further periodically compute the difference between the high temperature 560 and the low temperature 570. Responsive to determining that the difference between the high temperature 560 and the low temperature 570 is greater than or equal to a specified temperature threshold, the block family manager 510 can create a new active block family: the memory variable storing the active block family identifier 520 is updated to store the next block family number (e.g., the next sequential integer number), the memory variable storing the block family start time 550 is updated to store the current time 540, and the high temperature 560 and the low temperature 570 variables are updated to store the value of the current temperature of the selected die of the memory device.

At the time of programming a block, the memory sub-system controller associates the block with the currently active block family. The association of each block with a corresponding block family is reflected by the block family metadata 580, as described in more detail herein below with reference to FIG. 7.

As noted herein above, based on a periodically performed calibration process, the memory sub-system controller associates each package, and/or sub-package of every block family with a threshold voltage offset bin, which defines a set of threshold voltage offsets to be applied to the base voltage read level in order to perform read operations. The calibration process involves randomly selecting a specified number of blocks that reside in a given package or sub-package and are associated with a given block family, and performing, with respect to the selected blocks, read operations utilizing different threshold voltage offsets, in order to choose the threshold voltage offset that minimizes the error rate of the read operation. Each time the calibration processes selects a new bin, the block family metadata 580 can be update to reflect the change. For example, the block family metadata can indicate the new bin associated with the block family.

Figure 6:
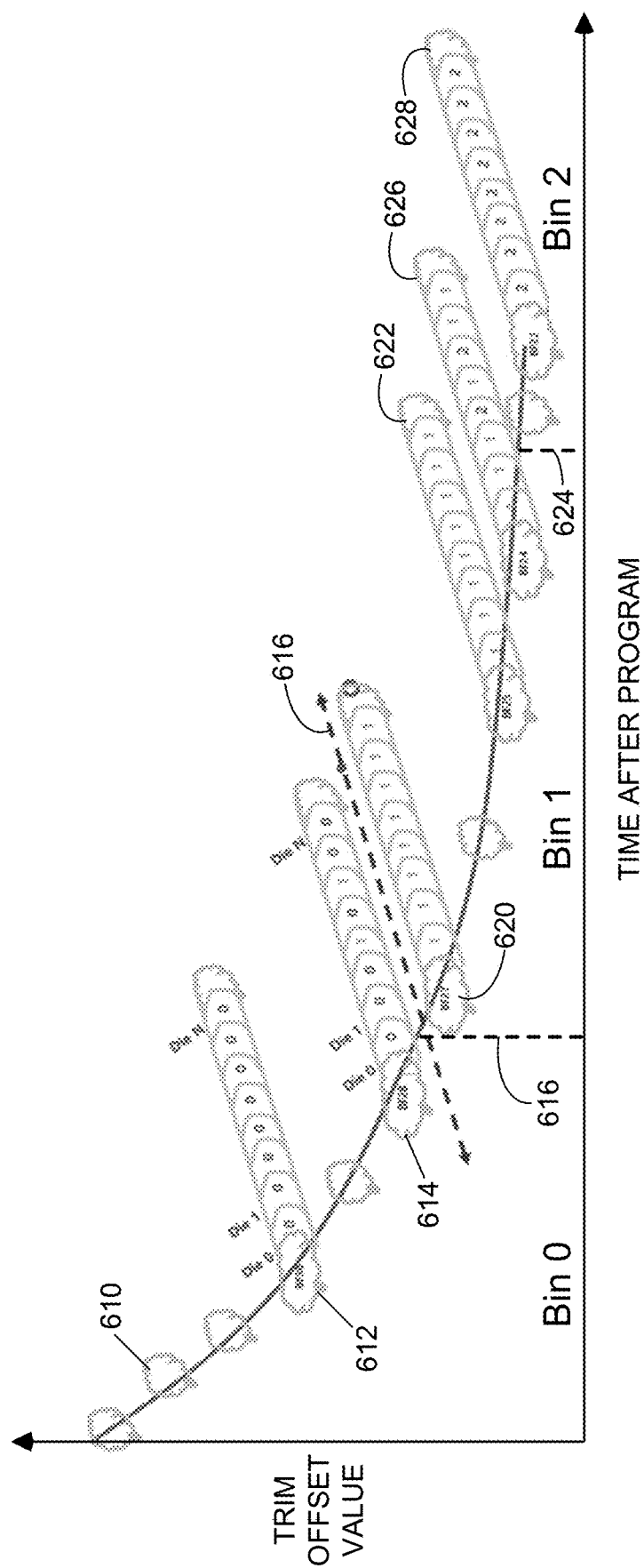
FIG. 6 schematically illustrates selecting block families for calibration, in accordance with embodiments of the present disclosure.

FIG. 6 schematically illustrates selecting block families for calibration, in accordance with embodiments of the present disclosure. Three bins are shown, named bin 0, bin 1, and bin 2. Bin 0 includes block families 610, 612, and 614. Bin 1 includes block families 620, 622, and 626. Bin 2 includes block family 628. Due to slow charge loss, the oldest block families in a voltage bin will migrate to the next voltage bin before any other block families of the current bin. As such, the memory sub-system controller can limit calibration operations to the oldest block families in a bin (e.g., block family 610 in bin 0 and block family 620 in bin 1). In some embodiments, the memory sub-system controller can identify the oldest block family in a voltage bin based on a bin boundary 616 for the bin. A bin boundary 515 can represent a boundary between two adjacent block families that are each associated with a different bin. The memory sub-system controller can identify the bin boundary 616 for a particular voltage bin using a block family metadata table, described in further detail below. The bin boundary 616 is between bins 0 and 1. A second bin boundary 624 is between bins 1 and 2.

Figure 7:
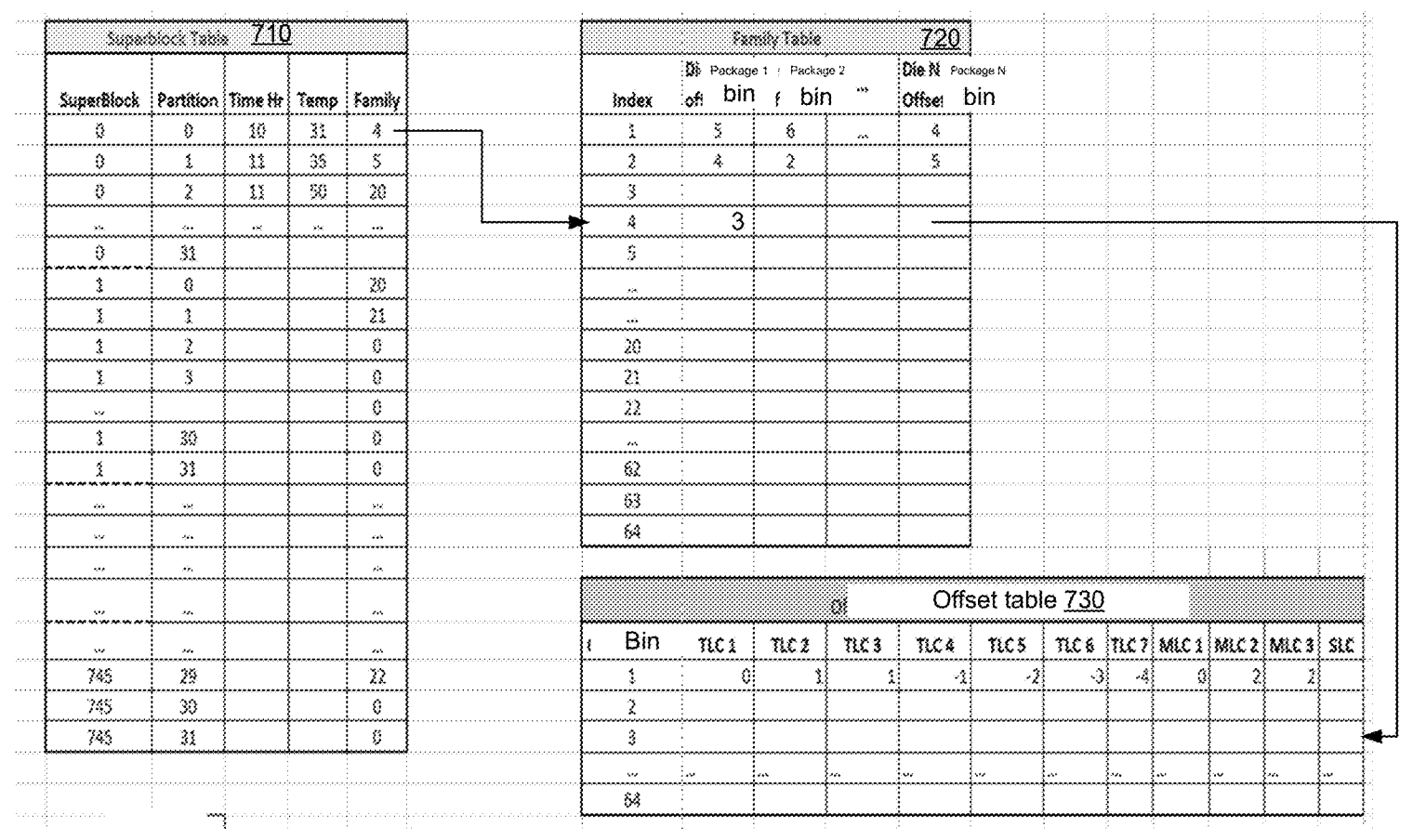

FIG. 7 schematically illustrates example metadata maintained by the memory sub-system controller for associating blocks and/or partitions with block families, in accordance with embodiments of the present disclosure. As schematically illustrated by FIG. 7, the memory sub-system controller can maintain the superblock table 710, the family table 720, and the offset table 730.

Each record of the superblock table 710 specifies the block family associated with the specified superblock and partition combination. In some implementations, the superblock table records can further include time and temperature values associated with the specified superblock and partition combination.

The family table 720 is indexed by the block family number, such that each record of the family table 720 specifies, for the block family referenced by the index of the record, a set of threshold voltage offset bins associated with respective packages of the block family. In other words, each record of the family table 720 includes a vector, each element of which specifies the threshold voltage offset bin associated with the package referenced by the index of the vector element. The threshold voltage offset bins to be associated with the block family dies can be determined by the calibration process, as described in more detail herein above. In some embodiments, the family table 720 can be indexed by the block number, such that each record of the family table 720 specifies, for the block family referenced by the index of the record, a set of threshold voltage offset bins associated with respective sub-packages, dies, or any combination of dies, packages, and/or sub-packages of the block family. The memory sub-system controller 110 can use a firmware data structure to determine which die are associated with which package or sub-package.

Finally, the offset table 730 is indexed by the bin number. Each record of the offset table 730 specifies a set of threshold voltage offsets (e.g., for TLC, MLC, and/or SLC) associated with threshold voltage offset bin.

The metadata tables 710-730 can be stored on one or more memory devices 130 of FIG. 1. In some implementations, at least part of the metadata tables can be cached in the local memory 119 of the memory sub-system controller 115 of FIG. 1.

In operation, upon receiving a read command, the memory sub-system controller determines the physical address corresponding to the logical block address (LBA) specified by the read command. Components of the physical address, such as the physical block number and the die identifier, are utilized for performing the metadata table walk: first, the superblock table 710 is used to identify the block family identifier corresponding to the physical block number; then, a firmware data structure is used to determine which package and/or sub-package is associated with a die associated with the physical block number; then, the block family identifier is used as the index to the family table 720 in order to determine the threshold voltage offset bin associated with the block family and the package and/or sub-package; finally, the identified threshold voltage offset bin is used as the index to the offset table 730 in order to determine the threshold voltage offset corresponding to the bin. The memory sub-system controller can then additively apply the identified threshold voltage offset to the base voltage read level in order to perform the requested read operation.

In the illustrative example of FIG. 7, the superblock table 710 maps partition 0 of the superblock 0 to block family 4, which is utilized as the index to the family table 720 in order to determine that package 1 is mapped to bin 3. The latter value is used as the index to the offset table in order to determine the threshold voltage offset values for bin 3. A firmware data structure can be used to determine which die are in package 1.

Figure 8:
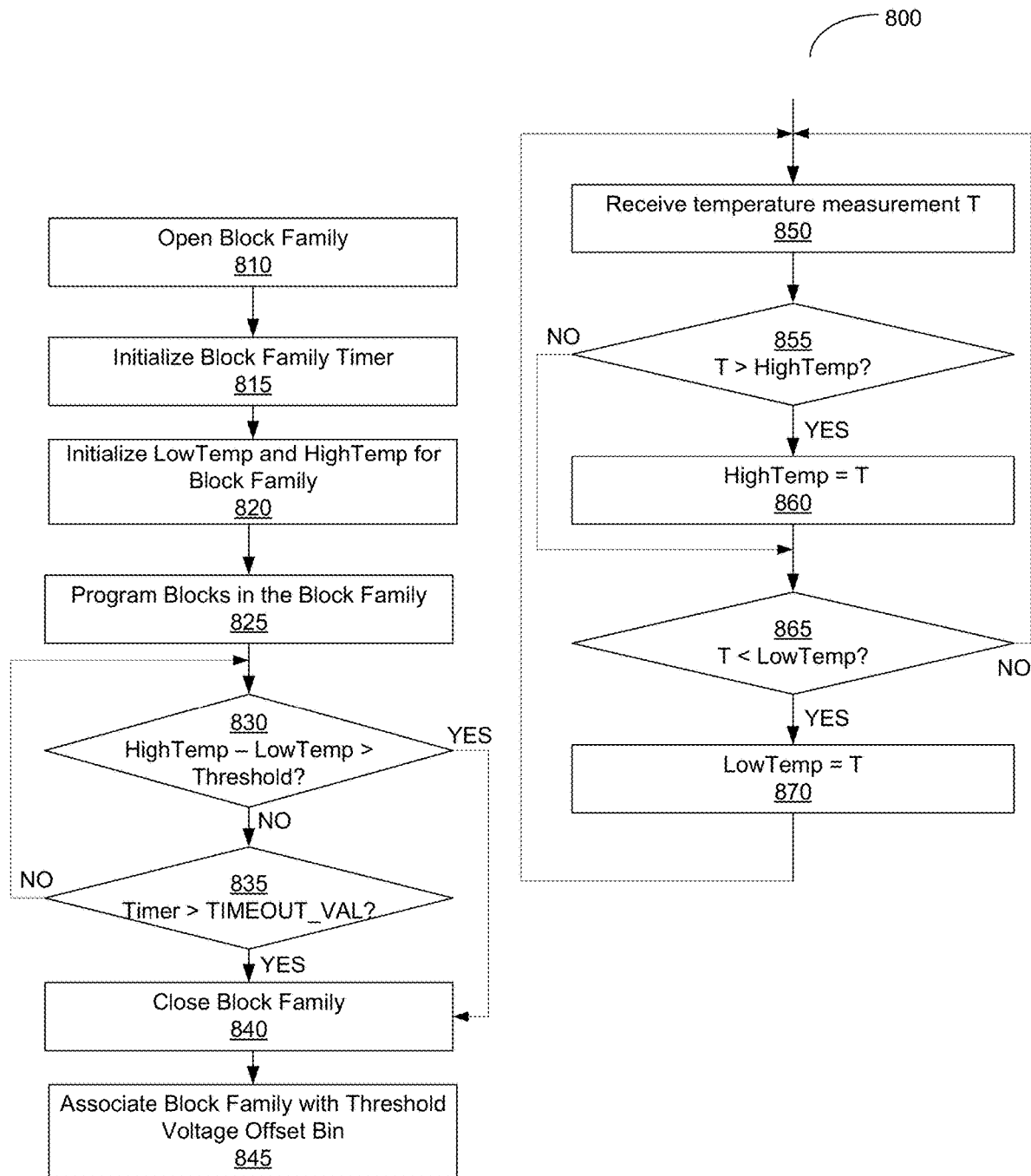
FIG. 8 is a flow diagram of an example method 800 of block family management implemented by a memory sub-system controller operating in accordance with some embodiments of the present disclosure.

FIG. 8 is a flow diagram of an example method 800 of block family management implemented by a memory sub-system controller operating in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the block family manager component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 810, the processing logic of the memory sub-system controller opens a block family associated with the memory device. For example, the processing device can initialize a block family, and allow the processing device to program (e.g., write) to the block family or read data from the block family. The processing device can store, in a memory variable, an identifier of the block family.

At operation 815, the processing logic initializes a timer associated with the block family. The timer can relate to a duration that the block family remains open. For example, responsive a value of the timer being greater than or equal to a specified timeout value, the processing logic can close the block family.

At operation 820, the processing device initializes the low temperature and the high temperature associated with the block family to store the current temperature of a selected die of the memory device (e.g., a randomly selected die).

At operation 825, the processing logic programs blocks in the block family. The blocks can reside on a single die of the memory device, or on multiple die of the memory device. Each block programmed can be associated to the block family. Responsive to associating a block (e.g., the first block, the second block, etc.) with the block family, the processing device can append, to block family metadata, a record associating the block with the block family.

Responsive to determining, at operation 830, that the difference between the high temperature and the low temperature values is greater than or equal to a specified temperature threshold value, the method branches to operation 840; otherwise, the processing continues at operation 835.

Responsive to determining, at operation 835, that the value of the timer associated with the block family is greater than or equal to a specified timeout value, the processing device can, at operation 840, close the block family; otherwise, the method loops back to operation 830.

Responsive to creating a block family, the processing logic can, at operation 845, associate each package or sub-package of the block family with a corresponding threshold voltage offset bin, as describe in more detail herein above. The processing logic can further detect triggering event(s). In response to the triggering event(s), the processing device can associate the package or the sub-package associated with the block family with a second threshold voltage offset bin based on, for example, a calibration process performed on a single die of the package or sub-package. The triggering event can be, for example, a time after programming exceeding a predetermined threshold value.

Responsive to performing operation 845, the method loops back to operation 810.

Operations 850-870 are performed asynchronously with respect to operations 810-860. In an illustrative example, operations 810-835 are performed by a first processing thread, and operations 850-870 are performed by a second processing thread.

At operation 850, the processing logic receives a temperature measurement at the selected die of the memory device.

Responsive to determining, at operation 855, that the received temperature measurement is greater than or equal to the stored high temperature value, the processing logic, at operation 860, updates the high temperature value to store the received temperature measurement.

Responsive to determining, at operation 865, that the received temperature measurement falls below the stored low temperature value, the processing logic, at operation 870, updates the low temperature value to store the received temperature measurement.

Figure 9:
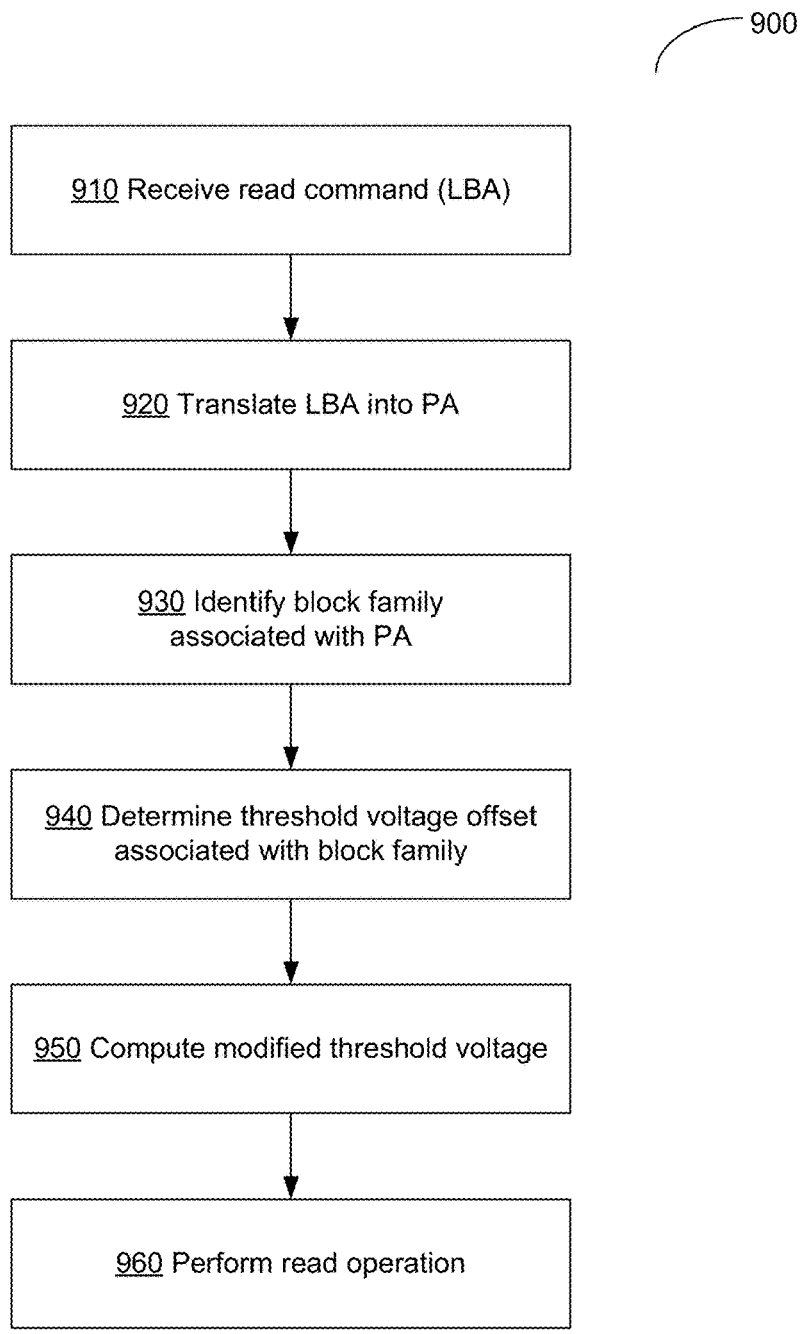
FIG. 9 is a flow diagram of an example method 800 of performing a read operation by a memory sub-system controller operating in accordance with some embodiments of the present disclosure.

FIG. 9 is a flow diagram of an example method of performing a read operation by a memory sub-system controller operating in accordance with some embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the block family manager component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 910, the processing logic of the memory sub-system controller receives a read command specifying an identifier of a logical block.

At operation 920, the processing logic translates the identifier of the logical block into a physical address (PA) of a physical block stored on the memory device. In an illustrative example, the translation is performed by looking up the logical block identifier (also referred to as logical block address, or LBA) in a logical-to-physical (L2P) table associated with the memory device. The L2P table includes multiple mapping records, such that each mapping record maps an LBA to a corresponding physical address. For flash memory devices, the physical address can include channel identifier, die identifier, page identifier, plane identifier and/or frame identifier.

At operation 930, the processing logic identifies, based on block family metadata associated with the memory device, a block family associated with the physical address. In an illustrative example, the processing device utilizes the superblock table 710 of FIG. 7 in order to identify the block family associated with the physical address.

At operation 940, the processing logic determines a threshold voltage offset associated with the block family and the memory device die. In an illustrative example, the processing logic utilizes the block family table 720 of FIG. 7, in order to determine the bin identifier corresponding to the combination of the block family identifier and the die identifier. The processing logic then utilizes the offset table 730 of FIG. 7 in order to determine the threshold voltage offsets for the identified threshold voltage offset bin.

At operation 950, the processing logic computes a modified threshold voltage by applying the identified threshold voltage offset to a base read level voltage associated with the memory device. As noted herein above, the base read level voltage can be stored in the metadata area of the memory device.

At operation 960, the processing logic utilizes the computed modified threshold voltage in order to perform the requested read operation. Responsive to completing operation 960, the method terminates.

Figure 10:
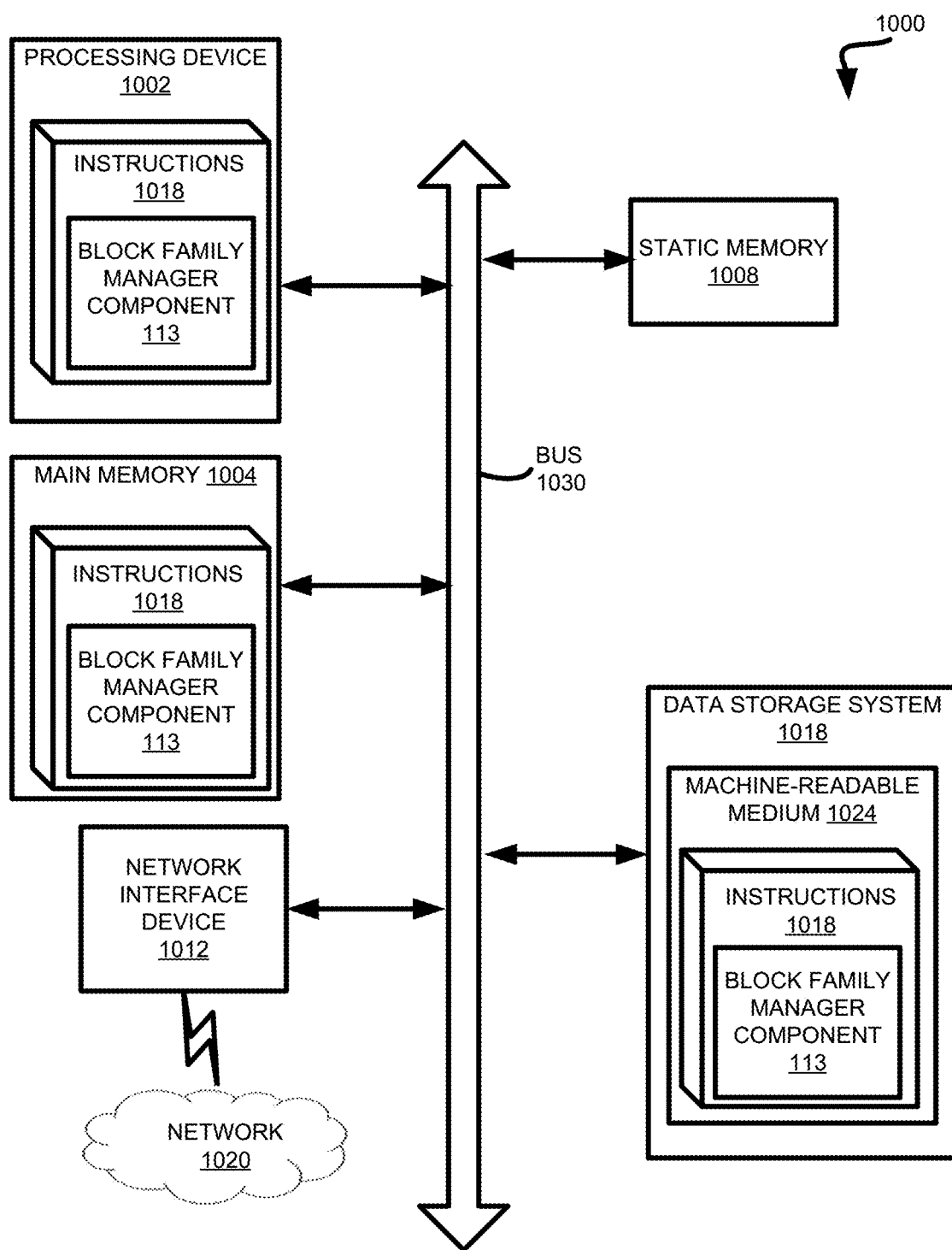
FIG. 10 is a block diagram of an example computer system in which embodiments of the present disclosure can operate.

FIG. 10 illustrates an example machine of a computer system 1000 within which a set of instructions, for causing the machine to perform any one or more of the methodologies discussed herein, can be executed. In some embodiments, the computer system 1000 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block family manager component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1010 (e.g., flash memory, static random access memory (SRAM), etc.), and a data storage system 1018, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1028 for performing the operations and steps discussed herein. The computer system 1000 can further include a network interface device 1012 to communicate over the network 1020.

The data storage system 1018 can include a machine-readable storage medium 1024 (also known as a computer-readable medium) on which is stored one or more sets of instructions 1028 or software embodying any one or more of the methodologies or functions described herein. The instructions 1028 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1018, and/or main memory 1004 can correspond to the memory sub-system 110 of FIG. 1.

In one embodiment, the instructions 1028 include instructions to implement functionality corresponding to the block family manager component 113 of FIG. 1. While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled to the memory device, to perform operations comprising:
initializing a block family associated with the memory device;
programming a first block in a first die of the memory device and a second block in a second die of the memory device, wherein the first die and the second die are assigned to a die group;
associating the first block and the second block with the block family; and
associating the die group with a first threshold voltage offset bin.

2. The system of claim 1, wherein the die group comprises a plurality of dice from a single substrate.

3. The system of claim 1, wherein the die group comprises a first die from a first substrate and a second die from a second substrate.

4. The system of claim 1, wherein the processing device is further to perform operations comprising:
responsive to detecting a triggering event, associating the die group with a second threshold voltage offset bin based on a calibration process performed on the first die.

5. The system of claim 1, wherein the processing device is further to perform operations comprising:
initializing a timer associated with the block family;
responsive to detecting expiration of the timer, closing the block family.

6. The system of claim 1, wherein associating the first block with the block family further comprises:
appending, to block family metadata, a record associating the first block with the block family.

7. The system of claim 1, wherein the processing device is further to perform operations comprising:
determining a threshold voltage offset associated with the block family; and
computing a modified threshold voltage by applying the threshold voltage offset to a base read level voltage associated with the memory device;
reading, using the modified threshold voltage, data from the first block of the block family.

8. A method comprising:
initializing a block family associated with the memory device;
programming a first block in a first die of the memory device and a second block in a second die of the memory device, wherein the first die and the second die are assigned to a die group;
associating the first block and the second block with the block family; and
associating the first die and the second die with a threshold voltage offset bin based on a calibration process performed on the first die.

9. The method of claim 8, wherein the first die and the second die are attached to a single substrate.

10. The method of claim 8, wherein the die group comprises a first die from a first substrate and a second die from a second substrate.

11. The method of claim 8, further comprising:
initializing a timer associated with the block family;
responsive to detecting expiration of the timer, closing the block family.

12. The method of claim 8, wherein associating the first block with the block family further comprises:
appending, to block family metadata, a record associating the first block with the block family.

13. The method of claim 8, further comprising:
determining a threshold voltage offset associated with the block family; and
computing a modified threshold voltage by applying the threshold voltage offset to a base read level voltage associated with the memory device;
reading, using the modified threshold voltage, data from the first block of the block family.

14. The method of claim 8, further comprising:
programming a third block in a third die of the memory device, wherein the third die is assigned to the die group;
associating the third block with the block family; and
associating the third die with a further threshold voltage offset bin based on a calibration process performed on the first die and a pre-characterized offset associated with the third die.

15. A non-transitory computer-readable storage medium comprising instructions that,
when executed by a processing device operatively coupled to a memory device, perform operations comprising:
initializing a block family associated with the memory device;
programming a first block in a first die of the memory device and a second block in a second die of the memory device, wherein the first die and the second die are assigned to a die group;
associating the first block and the second block with the block family; and
associating the die group with a first threshold voltage offset bin.

16. The non-transitory computer-readable storage medium of claim 15, wherein the die group comprises a plurality of dice from a single substrate.

17. The non-transitory computer-readable storage medium of claim 15, wherein the die group comprises a first die from a first substrate and a second die from a second substrate.

18. The non-transitory computer-readable storage medium of claim 15, wherein the processing device is further to perform operations comprising:
responsive to detecting a triggering event, associating the die group with a second threshold voltage offset bin based on a calibration process performed on the first die.

19. The non-transitory computer-readable storage medium of claim 15, wherein the processing device is further to perform operations comprising:
initializing a timer associated with the block family;
responsive to detecting expiration of the timer, closing the block family.

20. The non-transitory computer-readable storage medium of claim 15, wherein the processing device is further to perform operations comprising:
determining a threshold voltage offset associated with the block family; and
computing a modified threshold voltage by applying the threshold voltage offset to a base read level voltage associated with the memory device;
reading, using the modified threshold voltage, data from the first block of the block family.

\* \* \* \* \*